(12) United States Patent
Malin

(10) Patent No.: US 7,044,754 B2
(45) Date of Patent: May 16, 2006

(54) METER BOX CLAMP

(76) Inventor: Glen K. Malin, 130 West 22nd St., 4th floor, New York, NY (US) 10011

( * ) Notice: Subject to any disclaimer, the term of this patent is extended or adjusted under 35 U.S.C. 154(b) by 0 days.

(21) Appl. No.: 10/884,493

(22) Filed: Jul. 2, 2004

(65) Prior Publication Data

US 2006/0003611 A1 Jan. 5, 2006

(51) Int. Cl.
H01R 4/66 (2006.01)
(52) U.S. Cl. ............................. 439/92; 439/97; 439/433
(58) Field of Classification Search ................. 439/92, 439/97, 387, 433, 814, 813, 435
See application file for complete search history.

(56) References Cited

U.S. PATENT DOCUMENTS

| | | | | |
|---|---|---|---|---|
| 4,780,096 A | * | 10/1988 | Franks, Jr. | 439/813 |
| 4,828,504 A | | 5/1989 | Franks, Jr. | 439/92 |
| 4,904,193 A | * | 2/1990 | Graves | 439/92 |
| 4,993,960 A | * | 2/1991 | Franks, Jr. | 439/92 |
| 5,006,074 A | | 4/1991 | Franks, Jr. | 439/92 |
| 5,114,354 A | * | 5/1992 | Franks, Jr. | 439/92 |
| 5,746,609 A | * | 5/1998 | Franks, Jr. | 439/92 |
| 2004/0106309 A1 | * | 6/2004 | Larsson et al. | 439/92 |

* cited by examiner

Primary Examiner—Hien Vu
(74) Attorney, Agent, or Firm—Baker Botts L.L.P.

(57) ABSTRACT

An adjustable clamping device provides means for attaching a grounding wire to a metal boxes and in particular metal boxes coated with a thin layer of paint or other nonconductive material. An adjustable C-shaped clamp is provided with a grounding block between the wall of the meter box and the C-shaped clamp. The grounding block is formed with a plurality of abrading tips that extend from the block into engagement with the wall. A screw threaded through the clamp engages and exerts pressure on the grounding block towards the metal meter wall with abrading tips extending from the block into pressured contact with the wall. Means are provided for moving the grounding block and abrading tips parallel to the wall while the tips are maintained in pressure engagement with the wall whereby the tips abrade the wall as they move parallel thereto.

8 Claims, 1 Drawing Sheet

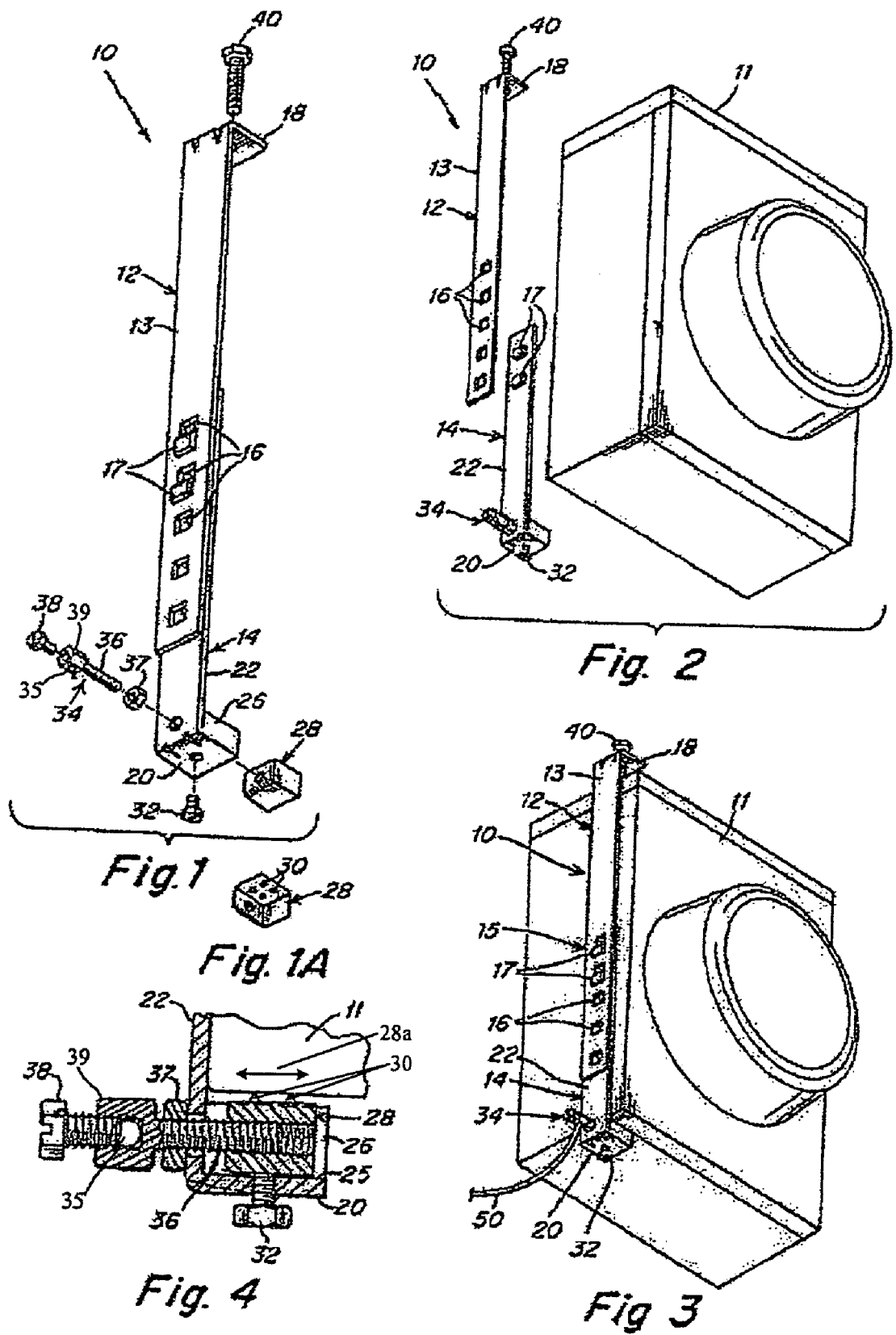

METER BOX CLAMP

FIELD OF INVENTION

The present invention relates to an adjustable grounding clamp for mechanically and electrically connecting a grounding wire to a metal box.

BACKGROUND OF INVENTION

It is well-known that electrical components at a particular facility, such as a residence, may be electrically grounded by using a grounding clamp to bond a grounding wire to the outside surface of a meter box serving that facility. However, bonding a grounding wire to a meter box poses certain problems. For example, the outer surface of a meter box is typically coated with a protective layer of paint or some other suitable nonconductive coating. Accordingly, a grounding clamp must be capable of piercing the coating of the meter box in order to achieve a suitable mechanical and electrical connection. The grounding clamp must also be flexible enough to deal with different placements of meter boxes, and the variety of meter box sizes. All of these factors must be addressed to provide a satisfactory grounding system.

U.S. Pat. Nos. 4,828,504 and 5,006,074 are directed to known grounding clamp systems for bonding grounding wires to meter boxes. Among the arrangements described in these patents is a C-shaped clamp. In it, a screw-like member with an abrading tip is threaded through one of the legs of the C-shaped clamp. This screw member is threaded through the end of the C-shaped clamp into pressured contact with the meter box, with its abrading tip shaped to cut through the outer protective coating of the meter box to establish electrical contact with the metal beneath this coating.

This known C-shaped grounding clamp has certain disadvantages. For one, the effective conductive contact between the clamp and the metal of the meter box is limited to the area of the abrading tip. Additionally, in an attempt to make a good ground connection, an operator of the clamp can excessively tighten the screw member, thereby bending the meter box or even piercing it.

SUMMARY OF INVENTION

It is thus an object of the present invention to provide an improved means for connecting a grounding wire to a meter box. It is also an object of the present invention to provide an improved means and method for achieving an effective electrical and mechanical connection between a grounding wire and meter box. A further object of the present invention is to provide a simple grounding clamp and method for using it in connection with attaching a grounding wire to a meter box.

These, and other objects and advantages are achieved by the present invention, which provides an adjustable grounding clamp that is suitable for use with a range of different sized meter boxes, and provides a grounding contact that is specifically shaped and sized for adequate penetration of the nonconductive coating on the metal surface of the meter box to which the grounding clamp is connected.

In an exemplary embodiment of the present invention, the grounding clamp comprises an elongated C-shaped clamp with arms extending from an elongated base. The C-shaped clamp preferably includes two segments, each of which are L-shaped. The longer legs of these L-shaped segments may be overlapped and formed with selectively interlocking components. These interlocking components, in a preferred embodiment, may comprise a series of hook and slot openings that permit the rigid engagement of the two elongated legs of the L-shaped members at discrete distances along the length of the members.

An abrading mechanism may be provided in the form of a grounding block between one of the end legs of the C-shaped clamp and the meter box. The grounding block may be integrally formed with a plurality of abrading tips which engage the surface of the meter box and are preferably held in pressured contact against the meter box by a set screw extending through the end leg of the C-shaped clamp. The grounding block may be moved parallel to the wall of the meter box by threading a connector through elongated center leg of the C-shaped clamp whereby the abrading tips penetrate the non-conductive layer on the meter box and engage the metal of the meter box at multiple points in intimate contact.

Other objects and advantages of the present invention will be more clearly understood when considered in conjunction with the accompanying drawings.

BRIEF DESCRIPTION OF DRAWINGS

The accompanying drawings are not drawn to scale. In the drawings, each identical or nearly identical component that is illustrated in various figures is represented by a like numeral. For purposes of clarity, not every component may be labeled in every drawing. In the drawings:

FIG. 1 is a bottom perspective view of a preferred embodiment of the present invention showing components in partially exploded arrangement;

FIG. 1A is a top perspective view of the grounding block of FIG. 1;

FIG. 2 is a bottom perspective view similar to that of FIG. 1 in which the clamp of the present invention is shown in exploded relation to the meter box;

FIG. 3 is a perspective view similar to that of FIGS. 1 and 2 in which the clamp is positioned on a meter box with a grounding wire attached; and FIG. 4 is a cross-sectional detail of the grounding unit.

DETAILED DESCRIPTIONS OF PREFERRED EMBODIMENTS

The preferred embodiment of the present invention includes the C-shaped clamp generally illustrated at 10 (FIG. 1). The C-shaped clamp is designed to be attached to meter box 11 (FIGS. 2 and 3). The C-shaped clamp in the preferred embodiment is adjustable in size. However, the present invention contemplates clamps of other shapes including, for example, clamps that are not adjustable and that are of a specific shape or size to fit a particular meter box.

In an exemplary embodiment of the present invention, the C-shaped clamp 10 is comprised primarily of an upper bracket 12 and lower bracket 14. When assembled, these brackets 12 and 14 form a center arm 15 (FIG. 3) of the C-shaped bracket. The upper bracket 12 comprises an elongated leg 13 and an upper leg 18. The lower bracket 14 comprises an elongated leg 22 and a lower leg 20. The upper bracket 12 and lower bracket 14 are interconnected and secured to one another by selectively interlocking hooks 17 and slots 16.

The slots 16 are formed at spaced positions along the upper bracket 12 near the end of the bracket 12 that is opposite to the upper leg 18. The hooks 17 are formed near the end of the lower bracket 14 that is opposite to the lower leg 20. The slots 16 comprise simple rectangular openings whereas the hooks 17 are offset segments of the lower bracket 14 that are die cut or otherwise suitably formed to provide conventional hook engagements for slots 16.

As illustrated, a plurality of slots 16 is provided to permit selective adjustment of the interlocked brackets 12 and 14. Thus, by selectively engaging the hooks 17 with the slots 16, the length of the elongated C-shaped clamp may be selectively adjusted. Those of ordinary skill in the art will appreciate that, in alternative embodiments, other adjustable arrangements may be used instead.

The C-shaped clamp fits along one side of the meter box 11 as illustrated in FIGS. 2 and 3. In this arrangement, the upper leg 18 engages the one end, e.g., the top wall, of the meter box 11 whereas the lower leg 20 engages an opposite end, e.g., the bottom wall, of the meter box 11. To accommodate for minor adjustments between the discrete sizes of the C-shaped clamp 10 and the length of the meter box, a set screw 40 is threaded through the upper leg 18 into pressure engagement with the top of the box 11. Preferably, the end of the screw 40 is pointed to minimize any torque that may otherwise be transmitted to the clamp 10 and inadvertently cause the clamp to turn.

The lower leg 20 is formed with a bottom wall 25 (FIG. 4) and a pair of opposite upstanding sidewalls 26 (FIGS. 1–4) to form an open ended u-shaped receptacle in which a grounding block 28 may be seated. Grounding block 28 is rectangular in shape, and is dimensioned so that it fits in the receptacle defined by the sidewalls 26 and the bottom 25 as illustrated in FIG. 4. In this arrangement, the grounding block 28 engages the sidewalls 26 by sliding along the sides of the sidewalls 26.

The grounding block 28 is also formed with a plurality of pyramid points 30 (FIGS. 1A and 4). These points, integrally formed with the grounding block, are preferably sufficiently hardened to function in the manner described below to cut through any electrically nonconductive layer, such as paint, on the surface of meter box and to engage in good electrical and mechanical contact with metal surface of the meter box 11.

A screw 32 is threaded through lower leg 20 and engages the grounding block 28 to securely hold the grounding block in pressured contact with the meter box 11. A connector 34 having a threaded shaft 36 is passed through a clearance hole in the lower bracket 14 into threaded engagement with the grounding block 28. The connector 34 may be conventionally designed with a threaded shaft 36, a locking nut 37, a hex head 39 and a wire capturing screw 38. The threaded half 36 is threaded into block 28. Upon tightening connector 34 the block 28 is drawn toward leg 22. A ground wire 50 may be inserted in a cross hole 35 in the hex head 39 of the connector 34 is secured by tightening the screw 38 in the axial box of the hex head 39. The locking nut 37 is optional.

In operation, the C-shaped clamp is fitted on a wall of the meter box. Preferably, the wall is an elongated sidewall but other walls may be used. The C-shaped clamp is appropriately sized to fit the box with the upper leg 18 and lower leg 20 close to the top and bottom sides of the meter box. This is achieved by interlocking the hooks 17 with appropriate slots 16 by conventional means. Minor adjustments to assure firm engagement of the clamp 10 with the meter box 11 are achieved by tightening the screw 40, which is threaded through the upper leg 18 into firm engagement with the top of the meter box.

The screw 40 should be tightened sufficiently so that the four tips 30 of the grounding block 28 securely engage the meter box and are forced through the meter box's nonconductive outer coating into direct contact with the metal of the meter box. Because legs 18 and 20 are relatively short, the force applied to the screw 40 will effectively force the tips 30 into electrical and mechanical contact with the metal of the meter box 11. Thereafter the connector 34 is tightened, forcing along direction 28a the grounding block 28 in toward the center arm 15 and causing the tips or points 30 to scratch and cut through the outer nonconductive coating into the metal of the meter box. Thereafter, screw 32 is further tightened to force the grounding block 28 into greater direct electrical and mechanical contact with the metal of the meter box. Thereafter the grounding wire 50 is conventionally connected to the connector 34 as illustrated in FIG. 3.

Although the present invention is illustrated in the foregoing description in terms of one preferred embodiment, other embodiments are contemplated. The C-shaped clamp may, for example, comprise a fixed C-shaped clamp without the adjustable means described. Alternately, the C-shaped claim of the present invention may be made adjustable using other techniques. For example, the slots in the upper and lower brackets may be aligned with one another, and a set screw may be used which extends through the slots and is engaged by a nut to clamp the upper and lower brackets together in fixed relation. Also, the ground block 28 may assume different shapes and may have more or less than four grounding points. Additionally, the shape of the tips or points may vary. The means for interlocking and holding the grounding block 28 between the meter box wall and the leg of the C-shaped clamp may also be varied. The grounding block 28 may be provided with a threaded opening aligned with the threaded end of the connector 34, so that the grounding block may the grounding wire and move as the connector is rotated.

Having thus described several aspects of at least one embodiment of this invention, it should be appreciated that various alterations, modifications, and improvements will readily occur to those skilled in the art. Such alterations, modifications, and improvements are intended to be part of this disclosure, and are intended to be within the spirit and scope of the invention. Accordingly, the description and drawings are by way of example only.

What is claimed is:

1. A method of grounding a conductor to a metal box comprising:
   positioning a grounding block having a plurality of abrading tips to be attached in a lower leg of a metal bracket, positioning the grounding block on a wall of the metal box, providing a fastener on the block and applying a force in a direction normal to the wall to cause the tips to engage the wall, and thereafter moving the block parallel to the wall by a second fastener to cause the tips to abrade the wall over at least a part of the lengths of the parallel movement, and connecting a conductor to the grounding block.

2. A method as set forth in claim 1 wherein the force applied to the block is a constant force sufficient to cause the abrading tips to intimately engage the metal surface of the box.

3. A method as set forth in claim 2 wherein the abrading tips conductively contact the metal surface under the force applied to the block.

4. A method as set forth in claim 2 wherein movement of the block parallel to the wall occurs while the force applied to the block is sufficient to cause the tip to penetrate the protective coating of the metal surface of the box.

5. A grounding clamp for a meter box comprising a grounding block attached to a lower leg of a metal bracket and being positioned on a wall of the meter box, said grounding block having a plurality of abrading tips extending from the block into engagement with the wall, clamp means including a fastener securing the block to the wall with the tips in pressured engagement with the wall, and means for moving the grounding block and abrading tip parallel to the wall while the block and tips are in pressured engagement with the wall whereby the tips abrade the wall as the tips are moved lengthwise thereof, wherein the grounding clamp further including fastener means for moving the grounding block in a direction orthogonal to said parallel direction.

6. A grounding clamp for a metal meter box having a conductive grounding block attached to a lower leg of a metal bracket by a fastener means, said grounding block having a plurality of conductive abrading tips extending therefrom shaped to penetrate a non-conductive layer on the meter box, means for securing the grounding block to a meter box with the abrading tips in pressured contact with a surface of the box, and means for moving the grounding block and the abrading tips parallel to the surface of the box while the block and the tips remain in the pressured contact with the surface of the box in a direction orthogonal to said parallel direction whereby the tips abrade the surface as the tips are moved lengthwise thereof.

7. A grounding clamp as set forth in claim 6 wherein the means for securing the grounding block to the metal meter box includes a c-shaped clamp with-legs extending from a center arm, and means on one of the arms for supporting the grounding block comprising a pair of side walls spaced apart extending from one leg to receive the grounding block.

8. A method of grounding a conductor to a metal box covered with a layer of non-conductive material comprising positioning a conductive block having a plurality of conductive abrading tips extending therefrom to be attached to a lower leg of a metal bracket, positioning the grounding block on a wall of said metal box with the abrading tips in contact with the layer, providing a fastener on the block and applying a force to the block in a direction normal to the wall sufficient to cause the tips to penetrate the layer, moving the block and tips parallel to the wall by a second fastener while the force is maintained to cause the tips to abrade the metal surface of the box and establish an intimate conductive contact between the metal of the box and the block.

* * * * *